United States Patent
Bian

(10) Patent No.: US 9,960,047 B2
(45) Date of Patent: May 1, 2018

(54) TEST PATTERN FOR TRENCH POLY OVER-ETCHED STEP AND FORMATION METHOD THEREOF

(75) Inventor: Zheng Bian, Jiangsu (CN)

(73) Assignees: CSMC Technologies Fab1 Co., Ltd., Jiangsu (CN); CSMC Technologies Fab2 Co., Ltd., Jiangsu (CN)

( * ) Notice: Subject to any disclaimer, the term of this patent is extended or adjusted under 35 U.S.C. 154(b) by 0 days. days.

(21) Appl. No.: 14/236,473

(22) PCT Filed: Jun. 7, 2012

(86) PCT No.: PCT/CN2012/076570
§ 371 (c)(1),
(2), (4) Date: Jan. 31, 2014

(87) PCT Pub. No.: WO2013/016975
PCT Pub. Date: Feb. 7, 2013

(65) Prior Publication Data
US 2014/0167045 A1  Jun. 19, 2014

(30) Foreign Application Priority Data
Aug. 3, 2011 (CN) .......................... 2011 1 0220937

(51) Int. Cl.
*H01L 21/66* (2006.01)
*H01L 21/306* (2006.01)

(52) U.S. Cl.
CPC ........ *H01L 21/30604* (2013.01); *H01L 22/12* (2013.01); *H01L 22/30* (2013.01)

(58) Field of Classification Search
CPC .......... H01L 22/12; H01L 22/34; H01L 22/30
See application file for complete search history.

(56) References Cited

U.S. PATENT DOCUMENTS

| | | | |
|---|---|---|---|
| 5,843,226 A * | 12/1998 | Zhao | ....................... C30B 29/06 117/92 |
| 6,087,733 A | 7/2000 | Maxim et al. | |
| 6,888,261 B2 | 5/2005 | Song et al. | |
| 7,052,575 B1 * | 5/2006 | Rangarajan et al. | .... 156/345.13 |
| 7,396,732 B2 * | 7/2008 | Kunnen | ................ H01L 21/762 257/E21.545 |
| 2009/0068767 A1 * | 3/2009 | Sirard et al. | ....................... 438/8 |
| 2010/0200960 A1 * | 8/2010 | Angyal | ................. H01L 23/585 257/620 |

FOREIGN PATENT DOCUMENTS

| | | |
|---|---|---|
| CN | 102097286 A | 6/2011 |
| CN | 102097287 A | 6/2011 |

* cited by examiner

*Primary Examiner* — Mounir Amer
(74) *Attorney, Agent, or Firm* — Muncy, Geissler, Olds & Lowe, P.C.

(57) ABSTRACT

A test pattern for testing a trench POLY over-etched step is provided. The test pattern is a trench (14) formed on a substrate (1); the trench (14) comprises a bottom surface and two side surfaces extending from the bottom surface; the trench (14) is formed on the substrate (1) with a preset angle of non-90° formed between the longitudinal direction (L) thereof and the longitudinal direction (X) of a wafer scribing trench. The test pattern can extend the scanning length of a step scanning equipment without changing the width of the trench.

8 Claims, 3 Drawing Sheets

140

Scanning signal of surface profilometry

Scanning signal of surface profilometry

Scanning signal of surface profilometry

TEST PATTERN FOR TRENCH POLY OVER-ETCHED STEP AND FORMATION METHOD THEREOF

FIELD OF THE INVENTION

The present invention relates a semiconductor manufacturing method, and more particularly relates to a polysilicon etching back technique.

BACKGROUND OF THE INVENTION

In the trench filling process, it is essential to obtain such parameters as the step depth of the trench after etching back the polysilicon (POLY) for process monitoring of the electronic device, e.g. TRENCH POWER MOS et al.

One way to obtain the depth of the step is to slice. Specifically, one wafer is selected from a plurality of wafers, then it is sliced along a direction vertical to the trench, and the depth of the trench is obtained by using microscope and other related equipments.

Another conventional approach is implemented by monitoring a test pattern. Briefly speaking, a test area with respect to the normal manufacturing area is formed during the manufacturing process. The test area has the same trench as the normal manufacturing area, and the required parameters is obtained by determining the relevant parameters of the trench in the test area.

If the width of the test pattern (i.e. the trench) is too small, the surface profilometry may not able to acquire correct scanning parameters, if the width is too large, the polysilicon will grow into a shape with a higher sidewall and a lower middle portion due to the filling feature of the ploysilicon in the trench, such that the surface profilometry may also not able to obtain the correct result. Accordingly, due to the limitation of the width of the test pattern, the current test pattern can not be too wide, while the surface profilometry can not obtain the correct scanning parameters under the current width.

SUMMARY OF THE INVENTION

In view of this, the present invention provides a test pattern for testing a trench POLY over-etched step to effectively solve the above problems. According to the present invention, the test pattern is a trench formed on a substrate, the trench comprising a bottom surface and two side surfaces extending from the bottom surface, wherein the trench is formed on the substrate with a preset angle of non-90° formed by a longitudinal direction of the trench and a longitudinal direction of a wafer scribing trench.

According to the test pattern of the present invention, preferably, the preset angle is greater than or equal to 10°. More preferably, the preset angle is greater than or equal to 30°.

According to the test pattern of the present invention, preferably, a width of the trench is in a range of from 0.18 microns to 0.36 microns. More preferably, the width of the trench is in a range of from 0.2 microns to 0.35 microns.

According to the test pattern of the present invention, preferably, a depth of the trench is in a range of from 0.98 microns to 2.02 microns. More preferably, the depth of the trench is in a range of from 1 microns to 2 microns.

The present invention also provides a method of fabricating a test pattern for testing a trench POLY over-etched step, which comprising: forming a trench on a substrate, the trench comprising a bottom surface and two side surfaces extending from the bottom surface, wherein the trench is formed on the substrate with a preset angle of non-90° formed by a longitudinal direction of the trench and a longitudinal direction of a wafer scribing trench.

According to the method of fabricating a test pattern for testing a trench POLY over-etched step of the present invention, preferably, the preset angle is greater than or equal to 10°. More preferably, the preset angle is greater than or equal to 30°.

According to the method of fabricating a test pattern for testing a trench POLY over-etched step of the present invention, preferably, a width of the trench is in a range of from 0.18 microns to 0.36 microns. More preferably, the width of the trench is in a range of from 0.2 microns to 0.35 microns.

According to the method of fabricating a test pattern for testing a trench POLY over-etched step of the present invention, preferably, a depth of the trench is in a range of from 0.98 microns to 2.02 microns. More preferably, the depth of the trench is in a range of from 1 microns to 2 microns.

According to the method of fabricating a test pattern for testing a trench POLY over-etched step of the present invention, preferably, a plurality of trenches are formed on the substrate.

According to the present invention, the scanning length is increased while maintaining a constant conventional width of the trench, such that the step scanning equipment can obtain a longer scanning length and an accurate scan result.

DETAILED DESCRIPTION OF THE EMBODIMENTS

Figure 1:
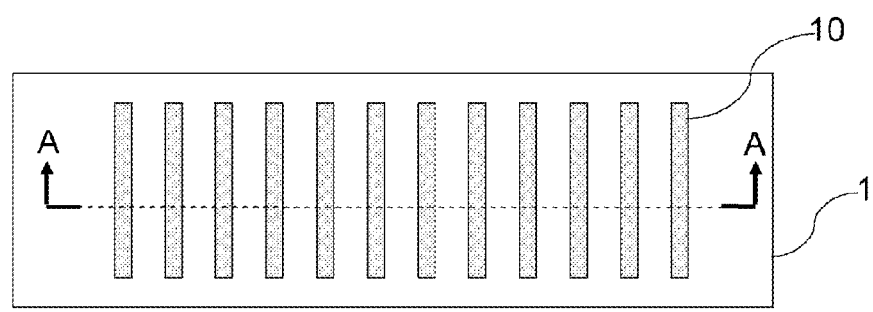
FIG. 1 is a schematic, top view of a conventional test pattern.

Reference will now be made to the drawings to describe, in detail, embodiments of the present invention. The components in the drawings are not necessarily drawn to scale, the emphasis instead being placed upon clearly illustrating the principles of the present disclosure. Moreover, in the drawings, like reference numerals designate corresponding parts throughout the views.

Figure 2:
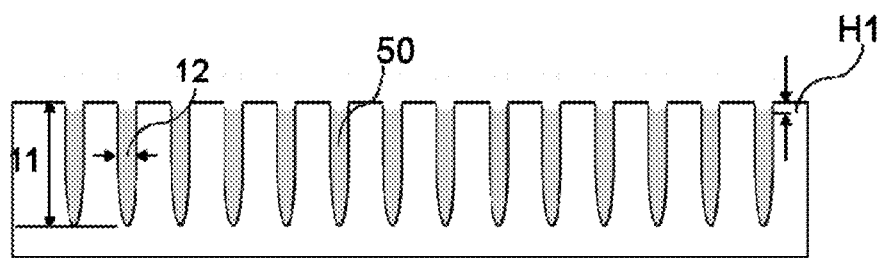
FIG. 2 is a schematic cross-sectional view taken along line A-A of the test pattern shown in FIG. 1.
Figure 3:
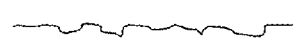
FIG. 3 illustrates a result of a surface profilometry scanning the test pattern shown in FIG. 1.

FIG. 1 is a schematic, top view of a conventional test pattern. The test pattern shown in FIG. 1 is formed on a test area of a silicon substrate by etching. After the etching back of the polysilicon, the test pattern on the test area is scanned by a surface profilometry to determine the depth of the test area. As shown in FIG. 1, the conventional test pattern is a concave trench, and a plurality of trenches are formed on the silicon substrate 1. FIG. 2 is a schematic cross-sectional view taken along line A-A of FIG. 1. As shown in FIG. 2, the trench has a width 12 and a depth 11. A depth difference H1 between the polysilicon 50 and the trench 10 can be obtained by scanning the trench shown in FIGS. 1 and 2 using the surface profilometry. FIG. 3 illustrates a result of a step scanning equipment (such as surface profilometry) scanning the conventional test pattern, it can be seen from the diagram that the result of the conventional test is not clear enough as a reference due to the trench width.

Figure 4:
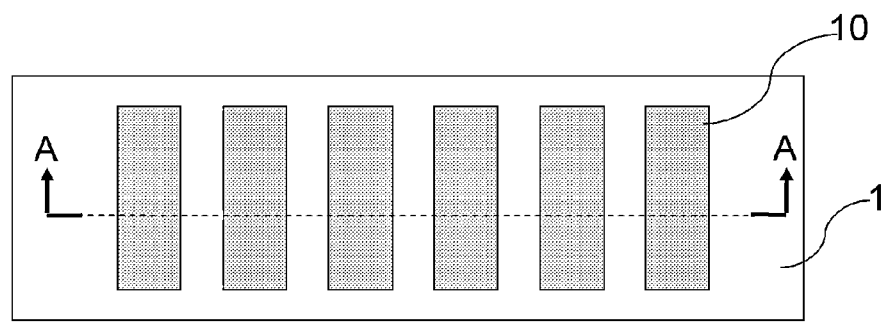
FIG. 4 is a schematic, top view of another test pattern with an increased trench width.
Figure 5:
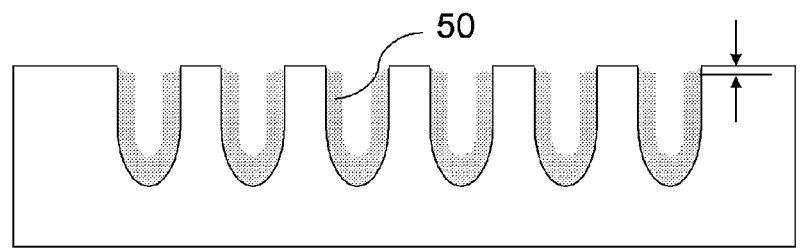
FIG. 5 is a schematic cross-sectional view taken along line A-A of the test pattern shown in FIG. 4.
Figure 6:
FIG. 6 illustrates a result of a surface profilometry scanning the test pattern shown in FIG. 4.

FIG. 4 is a schematic view of another test pattern with an increased trench width. Comparing with the test pattern shown in FIG. 1, the width of each trench 10 of the plurality of trenches formed on the silicon substrate 1 in FIG. 4 is increased. Along with the increase of trench width, the polysilicon will grow into a shape with a higher sidewall and a lower middle portion due to the filling feature of the ploysilicon in the trench, which can be seen in FIG. 5, where the ploysilicon is a grown ploysilicon. FIG. 5 is a schematic cross-sectional view taken along line A-A of FIG. 4. Under this circumstance, the surface profilometry is not able to obtain the correct result. FIG. 6 illustrates the result of a surface profilometry scanning the test pattern shown in FIG. 4.

Figure 7:
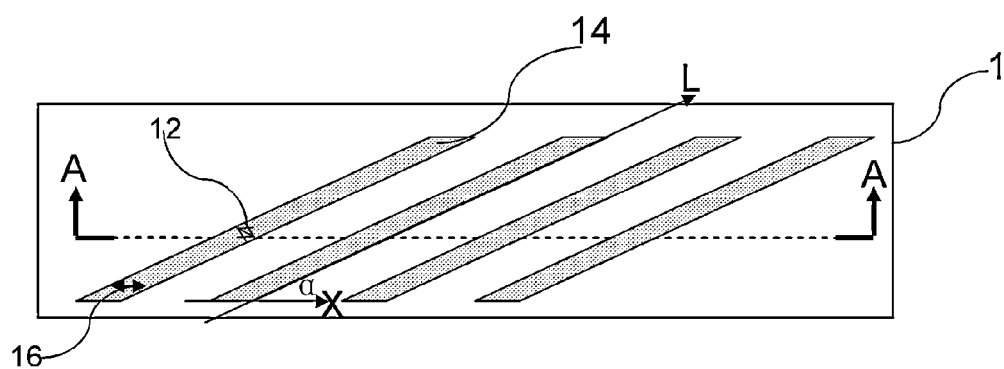
FIG. 7 is a schematic, top view of a test pattern according to the present invention.
Figure 8:
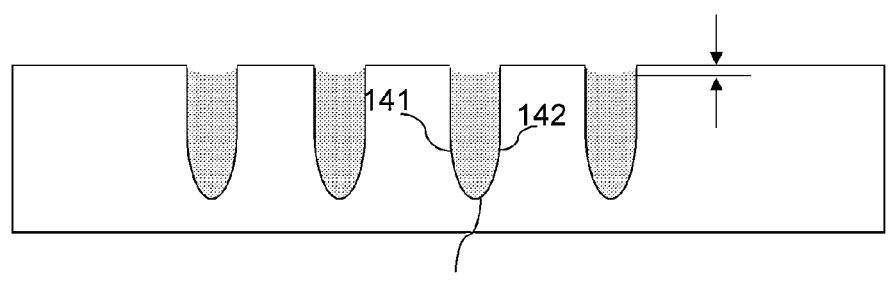
FIG. 8 a schematic cross-sectional view taken along line A-A of the test pattern shown in FIG. 7.

FIG. 7 is a schematic, top view of a test pattern according to the present invention. FIG. 8 a schematic cross-sectional view taken along line A-A of the test pattern shown in FIG. 7. Referring both to FIGS. 7 and 8, the test pattern (i.e. trench 14) of the present invention is also formed on a silicon substrate. Each trench includes a bottom surface 140 and two side surfaces (i.e. a first side surface 141 and a second side surface 142) extending from the bottom surface. As shown, the trench of the test pattern is formed on the silicon substrate, and a longitudinal direction of the trench (i.e. direction L shown in FIG) and a longitudinal direction of a wafer scribing trench (i.e. direction X shown in FIG) form a preset angle α of non-90°. According to the present invention, the preset angle α is greater than or equal to 10°, preferably, greater than or equal to 30°, more preferably equal to 30°. According to the present invention, a width 12 of the trench is in a range of from 0.18 microns to 0.36 microns, preferably from 0.2 microns to 0.35 microns. A depth 11 of the trench is preferably in a range of from 1 microns to 2 microns, while the error of the ±0.05 microns is acceptable, for example, the depth of the trench can be in a range of from 0.98 microns to 2.02 microns.

Figure 9:
FIG. 9 illustrates a result of a surface profilometry scanning the test pattern shown in FIG. 7.

As can be seen from the FIGs, the width of the trench can be the same as the width of the trench of the conventional techniques, i.e., the width of the trench in FIG. 7 can be same as that of the trench in FIG. 1. However, since the longitudinal direction of the trench in FIG. 7 forms the angle α with the longitudinal direction of a wafer scribing trench, when the step scanning equipment (such as the surface profilometry) scans the test pattern along the longitudinal direction of the wafer scribing trench, the scanning length of each trench changes from the original length (i.e. width 12) to the present scanning length (i.e. length 16), which is significantly greater than the width 12. Since the scanning length is increased, the step scanning equipment is capable of obtaining a more accurate scanning parameter, i.e. the depth difference H1 between the polysilicon grown in the trench and the trench depth. FIG. 9 illustrates a result of the surface profilometry scanning the test pattern shown in FIG. 7, it can be seen that the result is very clear. As can be seen from the above description, according to the present invention, the length of the trench along the longitudinal direction is greater than the trench width, such that in the case of maintaining a constant conventional width of the trench without affecting the growth of the polysilicon, each trench of the test pattern according to the present invention provides the scanning equipment a longer scan length to obtain a clear and accurate scan result.

According to the present invention, a method of fabricating a test pattern for testing a trench step is briefly described, which includes forming the test pattern (i.e. a plurality of trenches) shown in FIG. 7 on a silicon substrate. The trench includes a bottom surface 140 and two side surfaces (i.e. a first side surface 141 and a second side surface 142) extending from the bottom surface, such that the trench is formed on the substrate with the preset angle formed by the longitudinal direction of the trench and a longitudinal direction of the wafer scribing trench. As shown, the trench 14 of the test pattern is formed on the silicon substrate 1, and the longitudinal direction of the trench (i.e. direction L shown in FIG) and the longitudinal direction of a wafer scribing trench (i.e. direction X shown in FIG) form a preset angle α. According to the present invention, the preset angle α is greater than or equal to 10°, preferably, greater than or equal to 30°, more preferably equal to 30°. According to the present invention, a width 12 of the trench is in a range of from 0.18 microns to 0.36 microns, preferably from 0.2 microns to 0.35 microns. A depth 11 of the trench is preferably in a range of from 1 microns to 2 microns, while the error of the ±0.05 microns is acceptable, for example, the depth of the trench can be in a range of from 0.98 microns to 2.02 microns.

In the embodiments of the present invention, the term "vertical" in the present application includes not only "vertical", but also includes "substantially vertical" having errors within ±10°, preferably error within ±5°, and more preferably within ±2°. The term "longitudinal direction of the trench" refers to a length direction of the trench; the term "longitudinal direction of a wafer scribing trench" refers to a length direction of the wafer scribing trench.

To sum up, according to the present invention, in the case that the width of the trench is consistent with that of the conventional trench, since the configuration direction of the trench is changed, and the angle α is formed by the longitudinal direction of the trench and the longitudinal direction of the wafer scribing trench, when the step scanning equipment scans the test pattern, the scanning length of each trench changes from the original width to the present scanning length (i.e. length 16), which is significantly greater than the width 12 (shown in FIG. 7), such that the scanning length is increased while maintaining a constant conventional width of the trench, and the step scanning equipment can obtain a clear and accurate scan result. It should be noted that, although the advantages of the present invention is described by comparing with the conventional trench shown in FIG. 1, in fact, the width of the trench according to the invention can be different from the width of the conventional trench, for example, it can be slightly larger or smaller than that, as long as the longitudinal direction of the trench and the longitudinal direction of the wafer scribing trench form a preset angle of non-90°.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of fabricating a test pattern for testing a trench POLY over-etched step, comprising:

forming a trench on a substrate, the trench comprising a bottom surface and two side surfaces extending from the bottom surface, wherein the trench is formed on the substrate with a preset angle, the preset angle being less than or greater than 90°, formed by a longitudinal direction of the trench and a longitudinal direction of a wafer scribe line;

filling the trench with polysilicon;

after filling the trench, etching the polysilicon in the trench; and after etching the polysilicon, testing the trench POLY over-etched step by scanning, by a step scanning equipment, the test pattern along the longitudinal direction of the wafer scribe line and obtaining a depth difference between a surface of the polysilicon and an edge of the trench, wherein a width of the trench is in a range of from 0.18 microns to 0.36 microns.

2. The method according to claim 1, wherein the preset angle is greater than or equal to 10°.

3. The method according to claim 2, wherein the preset angle is greater than or equal to 30°.

4. The method according to claim 1, wherein the preset angle is greater than or equal to 30°.

5. The method according to claim 1, wherein the width of the trench is in a range of from 0.2 microns to 0.35 microns.

6. The method according to claim 5, wherein a depth of the trench is in a range of from 0.98 microns to 2.02 microns.

7. The method according to claim 1, wherein a depth of the trench is in a range of from 0.98 microns to 2.02 microns.

8. The method according to claim 7, wherein the depth of the trench is in a range of from 1 microns to 2 microns.

* * * * *